United States Patent
Yu et al.

(10) Patent No.: US 10,734,977 B1
(45) Date of Patent: Aug. 4, 2020

(54) EFFICIENT VOLTAGE CONTROLLED OSCILLATOR (VCO) ANALOG-TO-DIGITAL CONVERTER (ADC)

(71) Applicant: Silicon Laboratories Inc., Austin, TX (US)

(72) Inventors: Wenhuan Yu, Austin, TX (US); Abdulkerim L. Coban, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 0 days.

(21) Appl. No.: 16/379,874

(22) Filed: Apr. 10, 2019

(51) Int. Cl.
| | | |
|---|---|---|
| *H03K 3/03* | (2006.01) | |
| *H03M 3/00* | (2006.01) | |
| *H03M 1/60* | (2006.01) | |
| *H03M 1/12* | (2006.01) | |

(52) U.S. Cl.
CPC ........ *H03K 3/0315* (2013.01); *H03M 1/1245* (2013.01); *H03M 1/60* (2013.01); *H03M 3/424* (2013.01)

(58) Field of Classification Search
CPC .................................................. H03K 3/0315
USPC ........................................................ 331/57
See application file for complete search history.

(56) References Cited

U.S. PATENT DOCUMENTS

| | | | |
|---|---|---|---|
| 4,758,821 A | * | 7/1988 | Nelson .................... H03M 1/60 331/57 |
| 9,407,276 B1 | | 8/2016 | Coban et al. |
| 9,729,162 B1 | | 8/2017 | Yu et al. |

* cited by examiner

*Primary Examiner* — Joseph Chang
(74) *Attorney, Agent, or Firm* — Polansky & Associates, P.L.L.C.; Paul J. Polansky

(57) ABSTRACT

In one form, an analog-to-digital converter (ADC) includes first and second ring-oscillator ADCs, a modulus subtractor, and a decimation filter. The first and second ring-oscillator ADCs are responsive to true and complement input voltages, respectively, have outputs for providing first and second digital phase signals, respectively, each having a first predetermined number of bits sampled at a first frequency. The modulus subtractor subtracts the second digital phase signal from the first digital phase signal to provide a phase difference signal. The decimation filter differentiates the phase difference signal at a second frequency lower than said the frequency to provide a frequency signal proportional to a differential voltage between the true input voltage and the complementary input voltage, and decimates the frequency signal to provide a digital code having a second predetermined number of bits greater than the first predetermined number of bits.

20 Claims, 7 Drawing Sheets

EFFICIENT VOLTAGE CONTROLLED OSCILLATOR (VCO) ANALOG-TO-DIGITAL CONVERTER (ADC)

FIELD

The present disclosure relates generally to analog-to-digital converters (ADCs), and more particularly to ADCs based on voltage-controlled oscillators (VCOs).

BACKGROUND

In many integrated circuits, it is necessary to convert an analog signal, such as a voltage, into a digital representation for further processing. There are several known analog-to-digital converter (ADC) architectures, including delta-sigma, flash ADC, successive approximation, R2R, and the like. One ADC architecture that has been recently developed is the voltage-controlled oscillator (VCO) ADC. A VCO ADC (also known as a ring-oscillator based ADC) receives an input voltage and converts the input voltage into a digital code. The input voltage is used to control inverting stages of the ring oscillator, and the frequency of ring oscillator varies according to the input voltage. The propagation of a signal through the stages of the ring oscillator is sampled by a sampling clock. The number of stages through which the signal propagates represents the instantaneous phase. The ring-oscillator ADC determines the oscillation frequency by measuring the change in phase over time, and represents the frequency, which is proportional to the input voltage, as a digital code.

Two ring-oscillator ADCs of this sort can be used to covert a differential input voltage into a corresponding digital code. The ring-oscillator core has a relatively simple design, but the ring-oscillator ADC requires additional processing circuits to produce the digital code. For example, the phase represented by the propagation of a logic state through the stages of the ring oscillator has to be sampled and encoded, and the phase has to be differentiated. To expand the range of the ring oscillator, it is known to add a range extending logic circuit, but then the output of the range extending logic circuit and the encoders must be combined using additional digital circuits. Moreover, the sampling clock needs to have a relatively high frequency, which requires the output to be decimated to provide the digital signal at a suitable lower frequency. The decimation operation is typically done using a cascaded-integrator-comb (CIC) filter, which is a digital filter that itself requires both differentiator and integrator stages mainly consisting of flip-flops and full adder cells. The result is that a practical implementation of the ring-oscillator ADC has significant complexity and power consumption that diminishes the attractiveness of this architecture.

Figure 1:
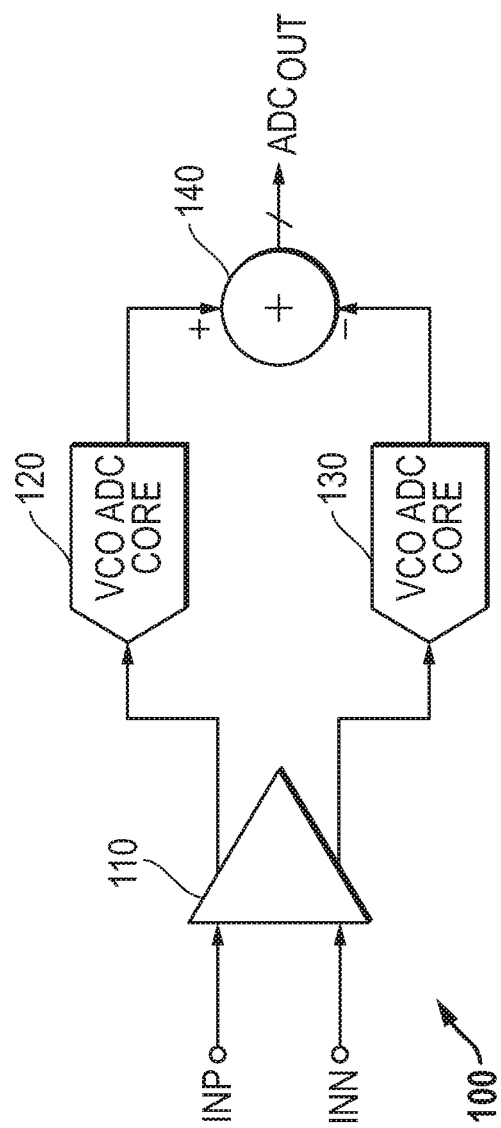
FIG. 1 illustrates in block diagram form a signal processing circuit known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

FIG. 1 illustrates in block diagram form a signal processing circuit 100 known in the prior art. Signal processing circuit 100 includes generally a differential amplifier 110, voltage-controlled oscillator (VCO)-based ADC core 120, a VCO-based ADC core 130, and a summing device 140. Differential amplifier 110 can be a voltage buffer interfacing the preceding signal chain blocks to the ADC core with or without voltage gain, or in other circuits, can be replaced by a front-end filter. Differential amplifier 110 has inputs for receiving positive and negative components of a differential input signal labeled "INP" and "INN", respectively, and positive and negative outputs. VCO-based ADC core 120 has an input connected to the positive output of differential amplifier 110, and an output. VCO-based ADC core 130 has an input connected to the negative output of differential amplifier 110, and an output. Summing device 140 has a positive input connected to the output of VCO-based ADC core 120, a negative input connected to the output of VCO-based ADC core 130, and an output for providing an output of signal processing circuit 100 labeled "$ADC_{OUT}$".

Signal processing circuit 100 uses the VCO-based conversion technique to convert a differential input signal formed by signals INP and INN into a multi-bit digital code, $ADC_{OUT}$. The differential topology is typically chosen to suppress the odd-order distortions terms of the VCO tuning characteristics. In general, the VCO-based conversion technique applies the analog input voltage to a multi-stage ring oscillator, and determines a digital representation of the voltage based on the output of the stage that corresponds to the propagation of the signal through the ring oscillator. Further details of the VCO-based conversion technique will be discussed below.

Figure 2:
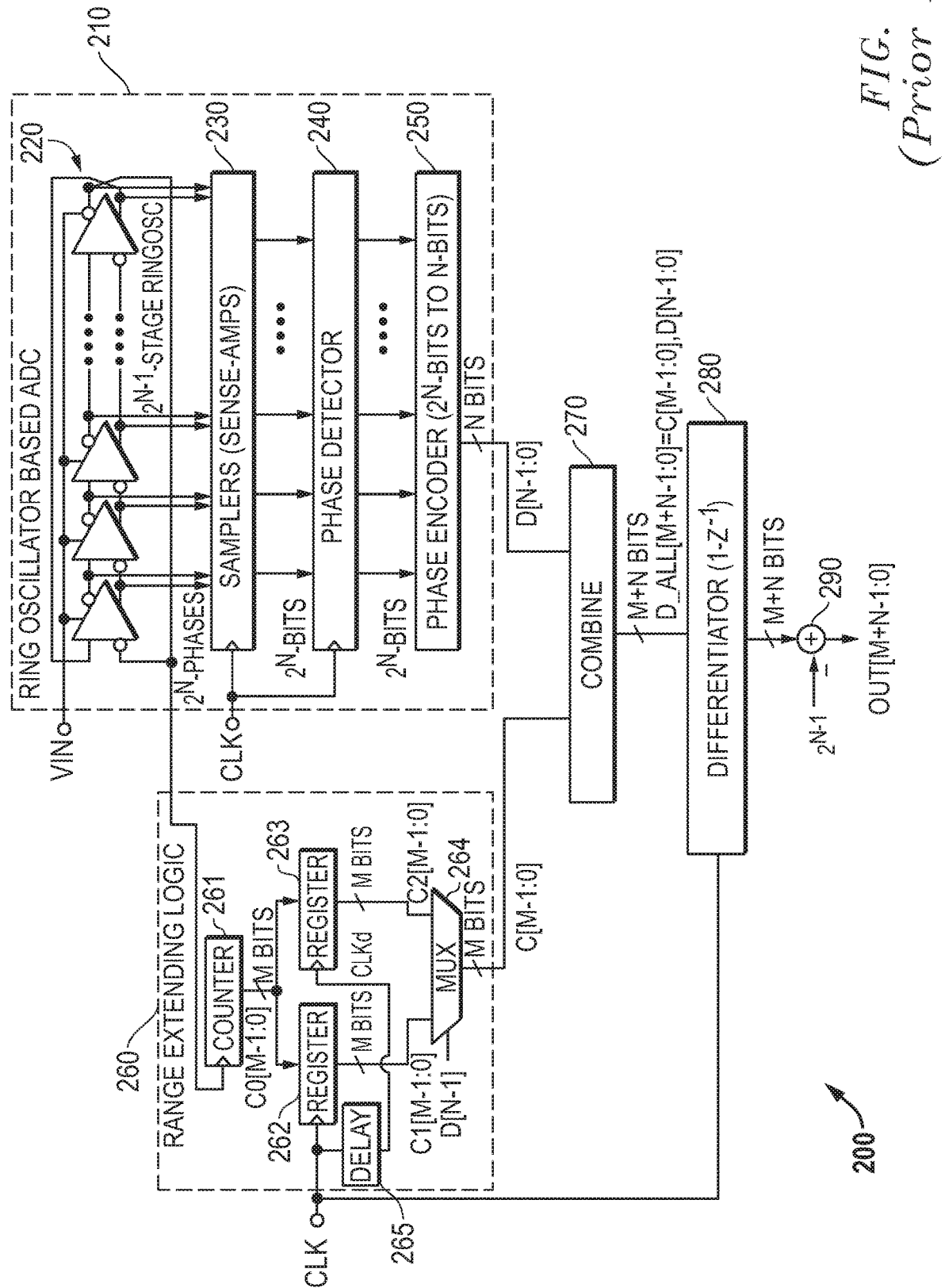
FIG. 2 illustrates in block diagram form a VCO-based ADC core known in the prior art suitable for use in the signal processing circuit of FIG. 1.

FIG. 2 illustrates in block diagram form a VCO-based ADC core 200 known in the prior art suitable for use in the signal processing circuit of FIG. 1. VCO-based ADC core 200 includes generally a ring-oscillator based ADC 210, a range extending logic circuit 260, and a combining circuit including a combining register 270, a differentiator 280, and a subtractor 290.

Ring-oscillator based ADC 210 includes a ring-oscillator circuit 220, a sampler circuit 230, a phase detector 240, and a phase encoder 250. Ring-oscillator circuit 220 is a $2^{N-1}$-stage pseudo-differential ring oscillator providing $2^N$ phase signals. Each stage includes a pseudo-differential inverter having true and complementary inputs, true and complementary outputs, and a control input for receiving a signal labeled "$V_{IN}$". The true output of the first stage is connected to the complementary input of the second stage, while the complementary output of the first stage is connected to the true input of the second stage. Each stage is connected to its succeeding stage in the same manner, until the last stage. The true output of the last stage is connected to the true input of the first stage, while the complementary output of the last stage is connected to the complementary input of the first stage. Sampler circuit 230 has $2^N$ phase inputs connected to corresponding phase outputs of ring-oscillator circuit 220, a clock input for receiving a sampling clock signal labeled "CLK", and $2^N$ outputs corresponding to the differential inputs. Phase detector 240 has $2^N$ inputs connected to corresponding outputs of sampler circuit 230, a clock input for receiving the CLK signal, and $2^N$ single-ended outputs corresponding to the inputs. Phase encoder 250 has $2^N$ inputs connected to corresponding outputs of phase detector 240, and an output for providing an N-bit digital code labeled "D[N-1:0]".

Range extending logic circuit 260 includes a counter 261, registers 262 and 263, a multiplexer 264, and a delay element 265. Counter 261 has a clock input connected to the complementary output of the last stage of ring-oscillator circuit 220, and an output for providing an M-bit output signal labeled "CO[M-1:0]". Register 262 has an input connected to the output of counter 261, a clock input for receiving the CLK signal, and an output for providing an M-bit output signal labeled "C1[M-1:0]". Register 263 has an input connected to the output of counter 261, a clock input for receiving a delayed clock signal labeled "CLKd", and an output for providing an M-bit output signal labeled "C2[M-1:0]". Multiplexer 264 has a first input connected to the output of register 262, a second input connected to the output of register 263, an output for providing a final M-bit count signal labeled "C[M-1:0]", and a control input for receiving signal D[N-1]. Delay element 265 has an input for receiving the CLK signal, and an output for providing the delayed clock signal CLKd.

In the combining circuit, combining register 270 has a first input connected to the output of multiplexer 264, a second input connected to the output of phase encoder 250, and an output for providing an M+N bit output labeled D_ALL[M+N-1:0]. Differentiator 280 has an input connected to the output of combining register 270, a clock input for receiving the CLK signal, and an output for providing an M+N bit output. Subtractor 290 has a positive input connected to the output of differentiator 280, a negative input for receiving a constant labeled "$2^{N-1}$", and an output for providing an output signal labeled "OUT[M+N-1:0]".

In operation, VCO-based ADC core 200 uses the simplicity of the ring-oscillator based ADC architecture but extends its input range reliably and efficiently. Ring-oscillator circuit 220 receives analog input voltage $V_{IN}$ and oscillates at a frequency proportional to $V_{IN}$. As $V_{IN}$ increases, the delay through each differential amplifier stage decreases, which would eventually cause an increase of the oscillation frequency. Sampler circuit 230 captures the state of ring-oscillator circuit 220 synchronously with respect to the CLK signal. The samplers in sampler circuit 230 are differential sense amplifiers that convert the difference in voltage between the true and complement signals into corresponding binary true and complement signals. Thus, sampler circuit 230 provides a thermometer code that indicates how far down the differential amplifier chain $V_{IN}$ has caused the input signal to propagate during one cycle of the CLK signal. Phase detector 240 and phase encoder 250 convert the $2^N$ bit wide output of sampler circuit 230 into an N-bit encoded digital signal D[N-1:0].

Range extending logic circuit 260 counts the transitions in the output of the last stage of ring-oscillator circuit 220. In particular, counter 261 counts in response to the complementary output of the last stage of ring-oscillator circuit 220. Thus range extending logic circuit 260 extends the range of $V_{IN}$ in an amount corresponding to the number of extra bits supported. For example, if M=1, then the input range is expanded by a factor of $2^1$=2, if M=2, then the input range is expanded by a factor of $2^2$=4, etc.

Range extending logic circuit 260 uses counter 261 as an unwrapping counter but does so with enhanced reliability. If counter 261 were used by itself, then range extending logic circuit 260 would operate unreliably if the output of counter 261 were sampled during a transition. Range extending logic circuit 260 double samples the output of counter 261 using both the CLK signal and a delayed version of the CLK signal, namely the CLKd signal, and multiplexer 264 selects one of these two signals based on the value of the most significant bit of the output of ring-oscillator based ADC 210.

Combining register 270 provides an M+N bit signal to represent the range-extended phase signal. Since this signal represents the sampled phase, differentiator 280 converts into a corresponding frequency (frequency is the change in phase per unit of time), which is proportional to $V_{IN}$. Subtractor 290 then re-normalizes the output signal by subtracting out a value corresponding to the size of ring-oscillator circuit 220.

Figure 3:
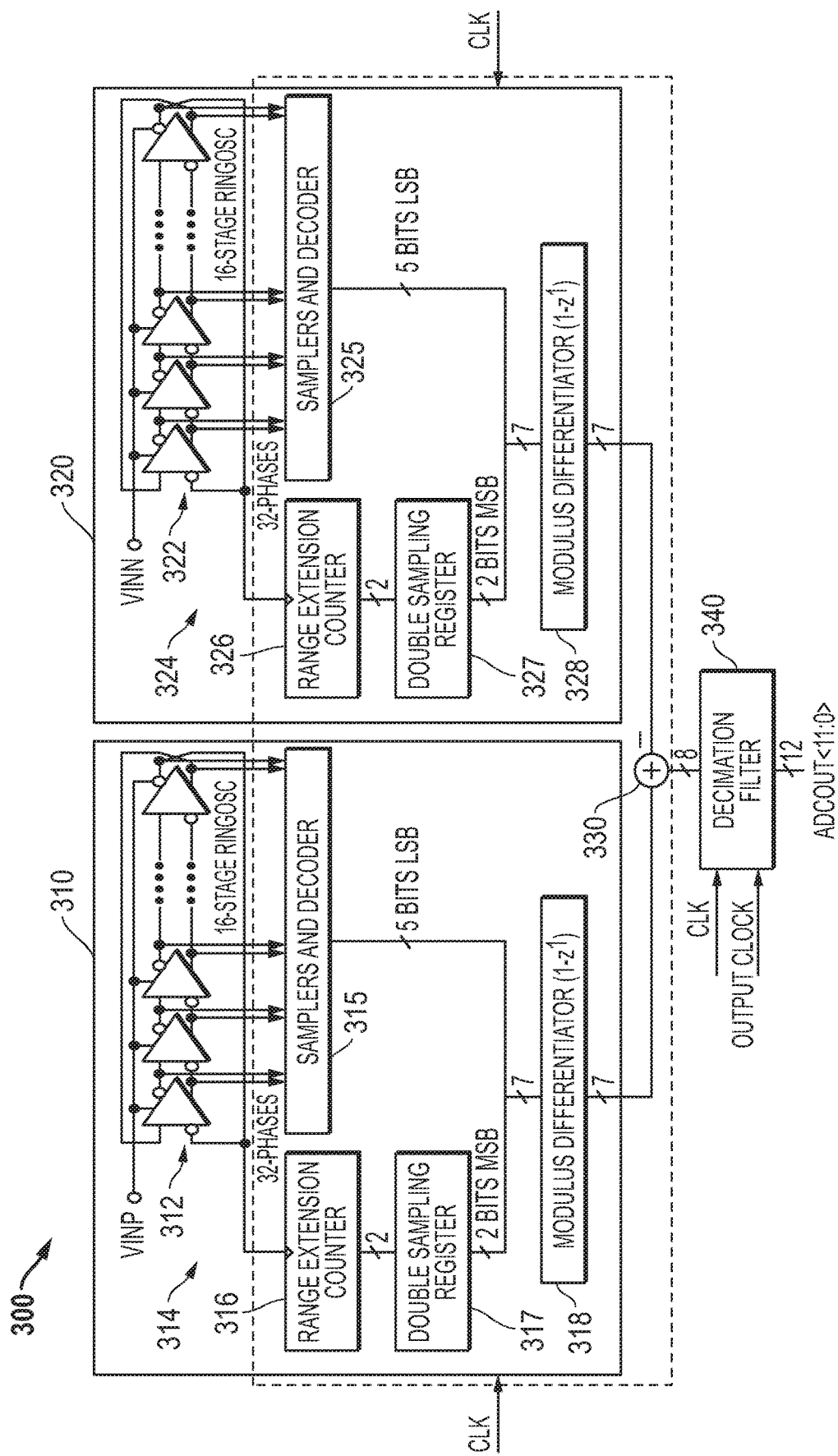
FIG. 3 illustrates in block diagram form a differential ADC based on the VCO-based ADC core of FIG. 2.

FIG. 3 illustrates in block diagram form a differential ADC 300 based on the VCO-based ADC core 200 of FIG. 2. Differential ADC 300 includes a ring-oscillator based ADC 310, a ring-oscillator based ADC 320, a subtractor 330, and a decimation filter 340. Ring-oscillator based ADC 310 is the positive signal ADC and has an input for receiving the $V_{INP}$ signal, and an output for providing a digital frequency signal, and operates using the sampling clock signal CLK. Ring-oscillator based ADC 320 is the negative signal ADC and has an input for receiving the $V_{INN}$ signal, and an output for providing a digital frequency signal, and operates using the sampling clock signal CLK. Subtractor 330 has a positive input connected to the output of ring-oscillator based ADC 310, a negative input connected to the output of ring-oscillator based ADC 320, and an output. Decimation filter 340 has an input connected to the output of subtractor 330, a first clock input for receiving the CLK signal, a second input for receiving a decimated output clock signal labeled "OUTPUT CLOCK", and an output for providing a signal labeled "ADCOUT[11:0]". In one implementation, a 320 MHz clock is chosen for the high-speed ADC sampling clock signal CLK, and an 80 MHz clock is chosen for the decimated output clock signal OUTPUT CLOCK, making the decimation ratio equal to 4.

Ring-oscillator based ADC 310 includes generally a ring-oscillator core 312 and a phase sampling circuit 314. Ring-oscillator core 312 includes a set of N inverting stages, such as the 16 inverting differential buffers shown in FIG. 3, each outputting true and complement outputs. Phase sampling circuit 314 includes a set of samplers and decoders 315, a range extension counter 316, and a double sampling register 317. Samplers and decoders 315 perform the function of sampler circuit 230, phase detector 240, and phase encoder 250 of VCO-based ADC core 200 of FIG. 2, and modulus differentiator 318 combines the outputs of samplers and decoders 315 and double sampling register 317 and performs the functions of combining register 270 and differentiator 280 of VCO-based ADC core 200 of FIG. 2.

Ring-oscillator based ADC 320 includes generally a ring-oscillator core 322 and a phase sampling circuit 324. Ring-oscillator core 322 includes a set of N inverting stages, such as the 16 inverting differential buffers shown in FIG. 3, each outputting true and complement outputs. Phase sampling circuit 324 includes a set of samplers and decoders 325, a range extension counter 326, and a double sampling register 327. Samplers and decoders 325 perform the function of sampler circuit 230, phase detector 240, and phase encoder 250 of VCO-based ADC core 200 of FIG. 2, and modulus differentiator 328 combines the outputs of samplers and decoders 325 and double sampling register 327 and performs the functions of combining register 270 and differentiator 280 of VCO-based ADC core 200 of FIG. 2.

In operation, each ring-oscillator ADC is a range extending ring-oscillator ADC that combines a 5-bit ring-oscillator output (N=5) with a 2-bit range extension logic circuit output (M=2) to provide a 7-bit output (5+2) that represents a frequency that corresponds to the difference between input voltages $V_{INP}$ and $V_{INN}$. Each ring-oscillator ADC operates using a 320 MHz sample clock, but differential ADC 300 includes a decimation filter to provide the output with a larger number of bits at a lower frequency, in this example 80 MHz. Thus, decimation filter 340 provides a 12-bit output ADC[11:0] by decimating the 8-bit output of subtractor 330 by a 4:1 ratio.

Differential ADC 300 performs several signal processing operations, including differentiation and decimation. In the aggregate these operations are complex and require a large amount of circuit area as well as a consume a significant amount of power. The differentiator in each of ring-oscillator based ADC 310 and ring-oscillator based ADC 320 corresponds to the sample-domain function $(1-z^{-1})$ and requires a number of state circuits (latches or registers) and full adders that operate at 320 MHz. Likewise, subtractor 330 operates at 320 MHz, and includes a set of eight full adders that operate at 320 MHz. Decimation filter 340 also requires quite a few state registers and full adders, some of which operate at 320 MHz and some of which operate at 80 MHz. This operation will now be described.

Figure 4:
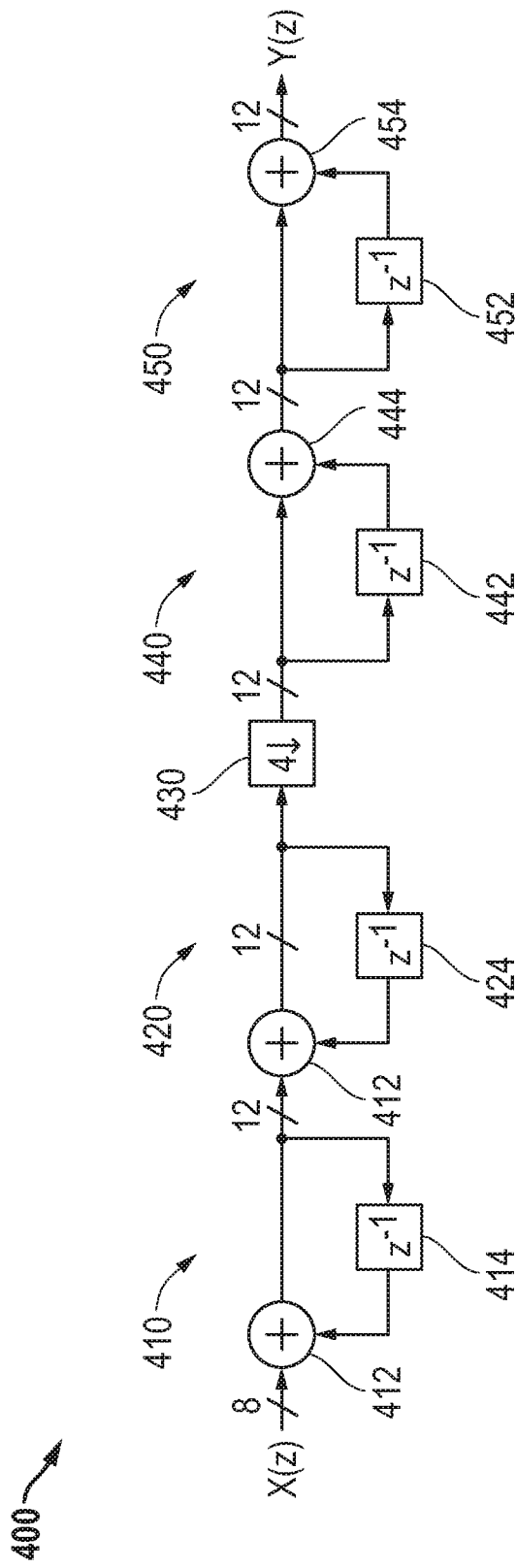
FIG. 4 illustrates in block diagram form a decimation filter that can be used to implement the decimation filter of FIG. 3.

FIG. 4 illustrates in block diagram form a decimation filter 400 that can be used to implement decimation filter 340 of FIG. 3. Decimation filter 400 includes a first integrator 410, a second integrator 420, a down sampler 430, a first differentiator 440, and a second differentiator 450.

First integrator 410 includes a summing device 412 and a delay element 414. Summing device 412 has a first positive input for receiving an 8-bit input signal labeled "X(z)", a second positive input, and a 12-bit output. Delay element 414 has an input connected to the output of summing device 412, and an output connected to the second positive input of summing device 412.

Second integrator 420 includes a summing device 422 and a delay element 424. Summing device 422 has a first positive input connected to the output of summing device 412, a second positive input, and a 12-bit output. Delay element 424 has an input connected to the output of summing device 422, and an output connected to the second positive input of summing device 422.

Down sampler 430 has an input connected to the output of summing device 422, and an output for providing a 12-bit signal down-sampled by a 4:1 ratio.

First differentiator 440 includes a delay element 442 and a summing device 444. Delay element 442 has an input connected to the output of down sampler 430, and an output.

Summing device 444 has a positive input connected to the output of down sampler 430, a negative input connected to the output of delay element 442, and an output.

Second differentiator 450 includes a delay element 452 and a summing device 454. Delay element 452 has an input connected to the output of summing device 444, and an output. Summing device 454 has a positive input connected to the output of summing device 444, a negative input connected to the output of delay element 452, and an output for providing a 12-bit output signal labeled "Y(z)".

Decimation filter 400 is a so-called cascaded-integrator-comb (CIC) filter. It performs the transfer function:

$$Hdec(z) = \left(\frac{1-z^{-4}}{1-z^{-1}}\right)^2 \quad [1]$$

which is known as a "sinc2" function in which the decimation ratio D is equal to 4 for 4:1 decimation. First integrator 410 and second integrator 420 operate at the input clock rate of 320 MHz. Each of summing devices 412 and 422 is implemented with a full adder operating at 320 MHz, whereas each of delay elements 414 and 424 is implemented with a D-type flip-flop that samples data at the input clock rate of 320 MHz. First differentiator 440 and second differentiator 450 operate at the output clock rate of 80 MHz. Each of delay elements 442 and 452 is implemented with a D-type flip-flop that samples data at the output clock rate of 80 MHz, whereas each of summing devices 444 and 454 is implemented with a full adder operating at 80 MHz. Note that, alternatively the delay elements in integrators 410 and 420 can be implemented in the feedforward path instead of the feedback path.

In the aggregate, differential ADC 300 using decimation filter 400 requires a large amount of digital circuitry and has high power consumption. In the example of FIGS. 3 and 4. it uses a total of 50 full adders operating at 320 MHz, 24 full adders operating at 80 MHz, 68 D-type flip-flops operating at 320 MHz, and 48 D-type flip-flops operating at 80 MHz. A differential ADC with reduced circuit complexity and reduced power consumption will now be described.

Figure 5:
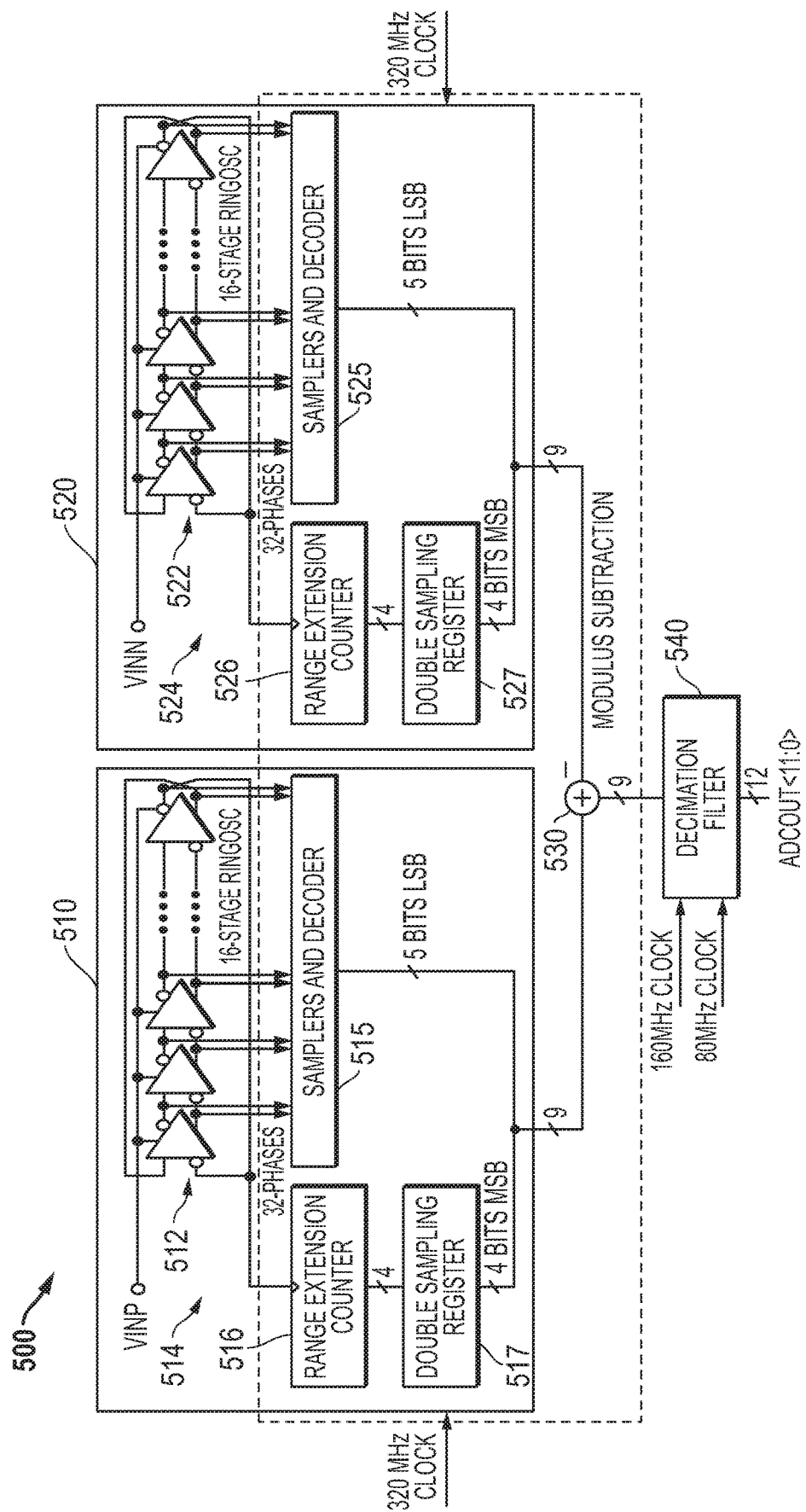
FIG. 5 illustrates in block diagram form a differential ADC according to embodiments of the present disclosure.

FIG. 5 illustrates in block diagram form a differential ADC 500 according to embodiments of the present disclosure. Differential ADC 500 includes a ring-oscillator based ADC 510, a ring-oscillator based ADC 520, a modulus subtractor 530, and a decimation filter 540. Ring-oscillator based ADC 510 is the positive signal ADC and has an input for receiving the $V_{INP}$ signal, and an output for providing a digital phase signal. Ring-oscillator based ADC 510 generally includes a ring-oscillator 512 and a phase sampling circuit 514. Phase sampling circuit 514 includes a sampler and decoder circuit 515, a range extension counter 516, and a double sampling register 517 that correspond to and perform the same functions as like elements in ring-oscillator based ADC 310 of FIG. 3.

Ring-oscillator based ADC 520 is the negative signal ADC and has an input for receiving the $V_{INN}$ signal, and an output for providing a digital phase signal. Ring-oscillator based ADC 520 generally includes a ring-oscillator 522, a phase sampling circuit 524. Phase sampling circuit 524 includes a sampler and decoder circuit 525, a range extension counter 526, and a double sampling register 527 that correspond to and perform the same functions as like elements in ring-oscillator based ADC 310 of FIG. 3.

Modulus subtractor 530 has a positive input connected to the output of ring-oscillator based ADC 510, a negative input connected to the output of ring-oscillator based ADC 520, and an output. Decimation filter 540 has an input connected to the output of modulus subtractor 530, a first clock input for receiving a 160 MHz clock signal, a second input for receiving an 80 MHz clock signal, and an output for providing the ADCOUT[11:0] signal.

In operation, each ring-oscillator based ADC is a range extending ring-oscillator based ADC that combines a 5-bit ring-oscillator output (N=5) with a 4-bit range extension logic circuit output (M=4) to provide a 9-bit output (5+4) that represents a phase that corresponds to the difference between input voltages $V_{INP}$ and $V_{INN}$. Each ring-oscillator based ADC operates using a 320 MHz sample clock, and decimation filter 540 provides the output with a larger number of bits at a lower frequency. Thus, decimation filter 340 provides a 12-bit output ADC[11:0] by decimating the 9-bit output of subtractor 330 by a 4:1 ratio.

However the inventors realized that the differentiator used in each ring-oscillator based ADC cancels out the integrator in the decimation filter. Thus differential ADC 500 merges the differentiator used in each ring-oscillator based with the first integrator in a conventional sinc decimation filter. Because the two ring-oscillator based ADCs now output phase signals, not frequency signals, differential ADC 500 substitutes modulus subtractor 530 for saturating subtractor 330 of differential ADC 300. Modulus subtractor 530 combines the two phase signals using modulus subtraction instead of saturating subtraction because the phases are instantaneous signals that roll over. Differential ADC 500 also implements the remaining part of the decimation filter as a polyphase filter, which is more power- and area-efficient than a conventional CIC filter like decimation filter 400 of FIG. 4.

Decimation filter 540 is a polyphase filter that converts the 9-bit phase difference signal into ADCOUT[11:0] at 80 MHz. Decimation filter 540 does so by decimating the phase difference signal by a 2:1 ratio using the lower-frequency 160 MHz clock signal, and then filtering the signal using a well-known sinc2 filter transfer function at 80 MHz. Thus, differential ADC 500 performs certain operations at 160 MHz that differential ADC 300 of FIG. 3 performed at 320 MHz. The inventors discovered that even after adding more bits for the range extension logic and input buses in decimation filter 540, differential ADC 500 significantly reduces net circuit area and net operating power compared to differential ADC 300 of FIG. 3.

The transfer function of the differentiators and filters in decimation filter 340 will now be analyzed. The transfer function of the differentiator at the output of each of ring-oscillator based ADC 310 and ring-oscillator based ADC 320 can be expressed as follows:

$$H\text{diff}(z) = 1 - z^{-1} \qquad [2]$$

Since ring-oscillator based ADC 310 and ring-oscillator based ADC 320 are effectively first-order delta-sigma modulators, decimation filter 340 can be implemented as a second-order sinc filter with 4:1 down sampling as shown by Equation [1] above. The combined transfer function of the differentiator in each ring-oscillator ADC and decimation filter 340 can be expressed as:

$$H\text{diff}(z)H\text{dec}(z) = (1-z^{-1})\left(\frac{1-z^{-4}}{1-z^{-1}}\right)^2 = (1-z^{-1})(1+z^{-1})^2(1+z^{-2})^2 \qquad [3]$$

This expression can be rewritten in a form corresponding to a polyphase implementation as follows:

$$H(z) = [1 - z^{-2} + z^{-1}(1 - z^{-2})](1 + z^{-4} + 2z^{-2}) \qquad [4]$$

The filter can be achieved with a down sampling of 4:1. The implementation of this transfer function will now be described.

Figure 6:
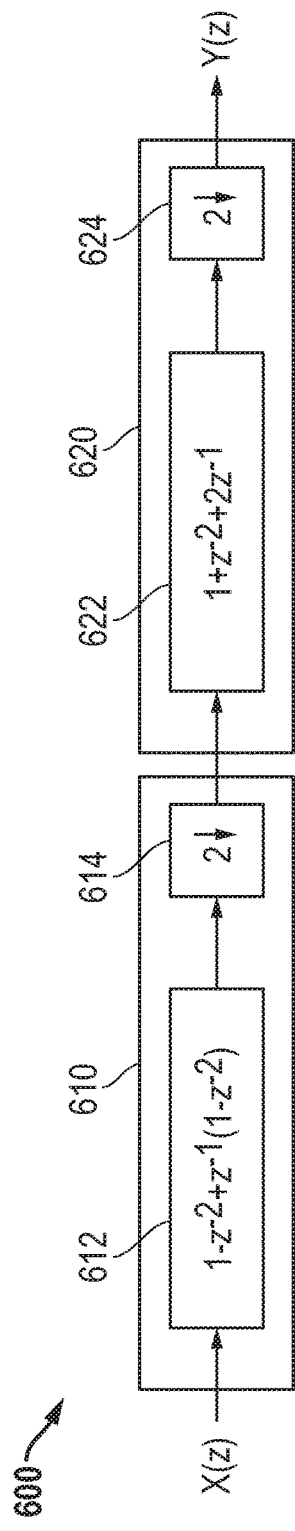
FIG. 6 illustrates in block diagram form a signal processing circuit that performs the signal processing operation of decimation filter 540 of FIG. 5.

FIG. 6 illustrates in block diagram form a signal processing circuit 600 that performs the signal processing operation of decimation filter 540 of FIG. 5. Signal processing circuit 600 includes a first stage 610 and a second stage 620. First stage 610 includes a filter circuit 612 and a down sampler 614. Filter circuit 612 has an input for receiving an input signal X(z), and an output and performs the bracketed portion of the transfer function of Equation [4]. Down sampler 614 has an input connected to the output of filter circuit 612, and an output. Second stage 620 includes a filter circuit 622 and a down sampler 624. Filter circuit 622 has an input connected to the output of down sampler 614, and an output and performs the portion of the transfer function of Equation [4] inside the parentheses. Down sampler 624 has an input connected to the output of filter circuit 612, and an output for providing an output signal labeled "Y(z)". Signal processing circuit 600 performs Equation [4] because it multiplies the bracketed portion of H(z) by the portion of H(z) in parentheses. Signal processing circuit 600 performs the portion H(z) in parentheses because the decimation by two performed in first stage 610 converts the $(1-z^{-2}+2z^{-1})$ transfer function of second stage 620 into a transfer function of $(1-z^{-4}+2z^{-2})$ as will be described further below. Signal processing circuit 600 performs the 4:1 down sampling by the combination of the 2:1 down sampling performed by down sampler 614 and the 2:1 down sampling performed by down sampler 624.

Figure 7:
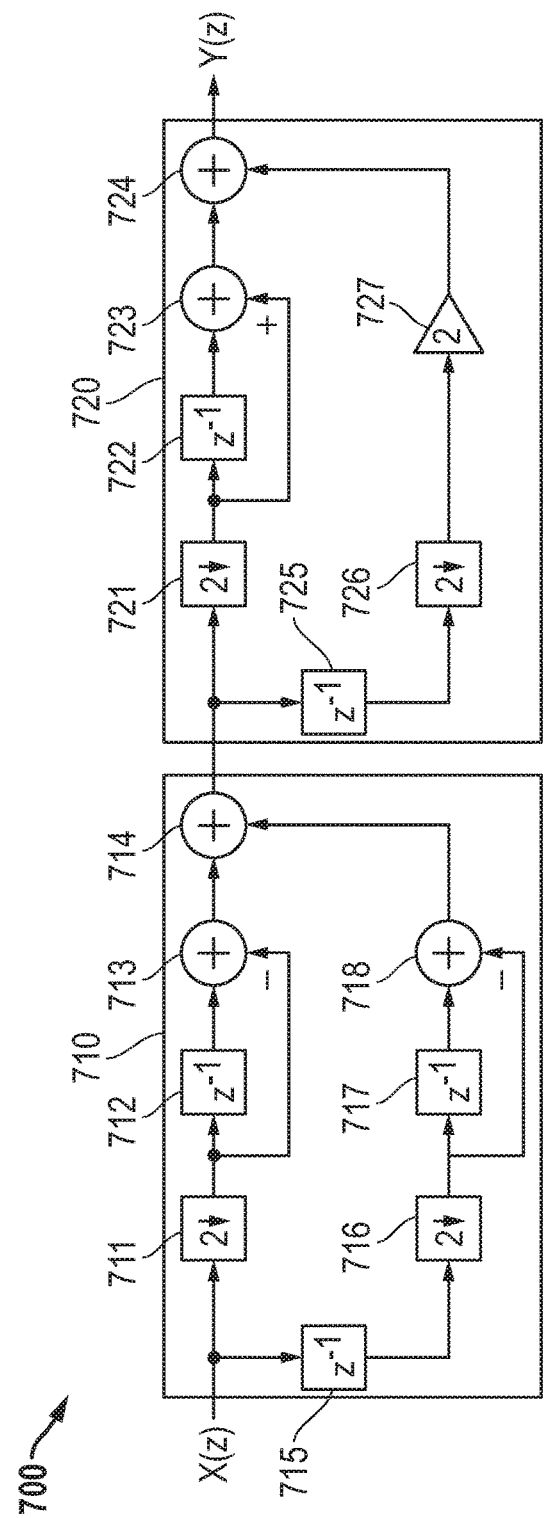
FIG. 7 illustrates in block diagram form a signal processing circuit that implements the signal processing circuit of FIG. 6 and that can be used as the decimator of FIG. 5.

FIG. 7 illustrates in block diagram form a signal processing circuit 700 that implements the signal processing circuit 600 of FIG. 6 and that can be used as decimation filter 540 of FIG. 5. Signal processing circuit 700 includes a first stage 710 and a second stage 720. First stage 710 includes a 2:1 down sampler 711, a delay element 712, adders 713 and 714, a delay element 715, a 2:1 down sampler 716, a delay element 717, and an adder 718. 2:1 down sampler 711 has an input for receiving X(z), and an output. Delay element 712 has an input connected to the output of down sampler 711, and an output. Adder 713 has a positive input connected to the output of delay element 712, a negative input connected to the output of down sampler 711, and an output. Adder 714 has a first positive input connected to the output of adder 713, a second positive input, and an output. Delay element 715 has an input for receiving signal X(z), and an output. 2:1 down sampler 716 has an input connected to the output of delay element 715, and an output. Delay element 717 has an input connected to the output of down sampler 716, and an output. Adder 718 has a positive input connected to the output of delay element 717, a negative input connected to the output of down sampler 716, and an output connected to the second positive input of adder 714.

Second stage 720 includes a 2:1 down sampler 721, a delay element 722, adders 723 and 724, a delay element 725, a 2:1 down sampler 726, and a multiplier 727. 2:1 down sampler 721 has an input connected to the output of adder 714, and an output. Delay element 722 has an input connected to the output of down sampler 721, and an output. Adder 723 has a positive input connected to the output of delay element 722, a negative input connected to the output of down sampler 721, and an output. Adder 724 has a first positive input connected to the output of adder 723, a second positive input, and an output for providing output signal Y(z). Delay element 725 has an input for receiving signal X(z), and an output. 2:1 down sampler 726 has an input connected to the output of delay element 725, and an output. Multiplier 727 has an input connected to the output of down sampler 726, and an output connected to the second positive input of adder 724.

In operation, signal processing circuit 700 implements the transfer function of Equation [4] using polyphase decomposition. First stage 710 performs the function of first stage 610 of signal processing circuit 600, and second stage 720 performs the function of second stage 620 of signal processing circuit 600. Each stage performs a 2:1 down sampling before performing their corresponding signal processing functions.

In first stage 710, delay element 712 and adder 713 perform the function $(1-z^{-1})$. Delay element 715 performs the function $z^{-1}$, and delay element 717 performs the function of $(1-z^{-1})$, and the output of adder 718 provides the quantity $z^{-1}(1-z^{-1})$. Thus the output of adder 714 is equal to $(1-z^{-1})+z^{-1}(1-z^{-1})$, which is the portion of Equation [4] in brackets.

In second stage 720, the top branch implements the even order term $(1-z^{-1})$ that, because of the 2:1 decimation, becomes $(1-z^{-2})$, while the bottom branch implements the odd order term $2z^{-1}$ that, because of decimation, becomes $2z^{-2}$. Thus second stage 720 implements the transfer function $(1-z^{-4}+2z^{-2})$, which is the portion of Equation [4] in parentheses. Thus, signal processing circuit 700 performs the overall transfer function given by Equation [4].

Figure 8:
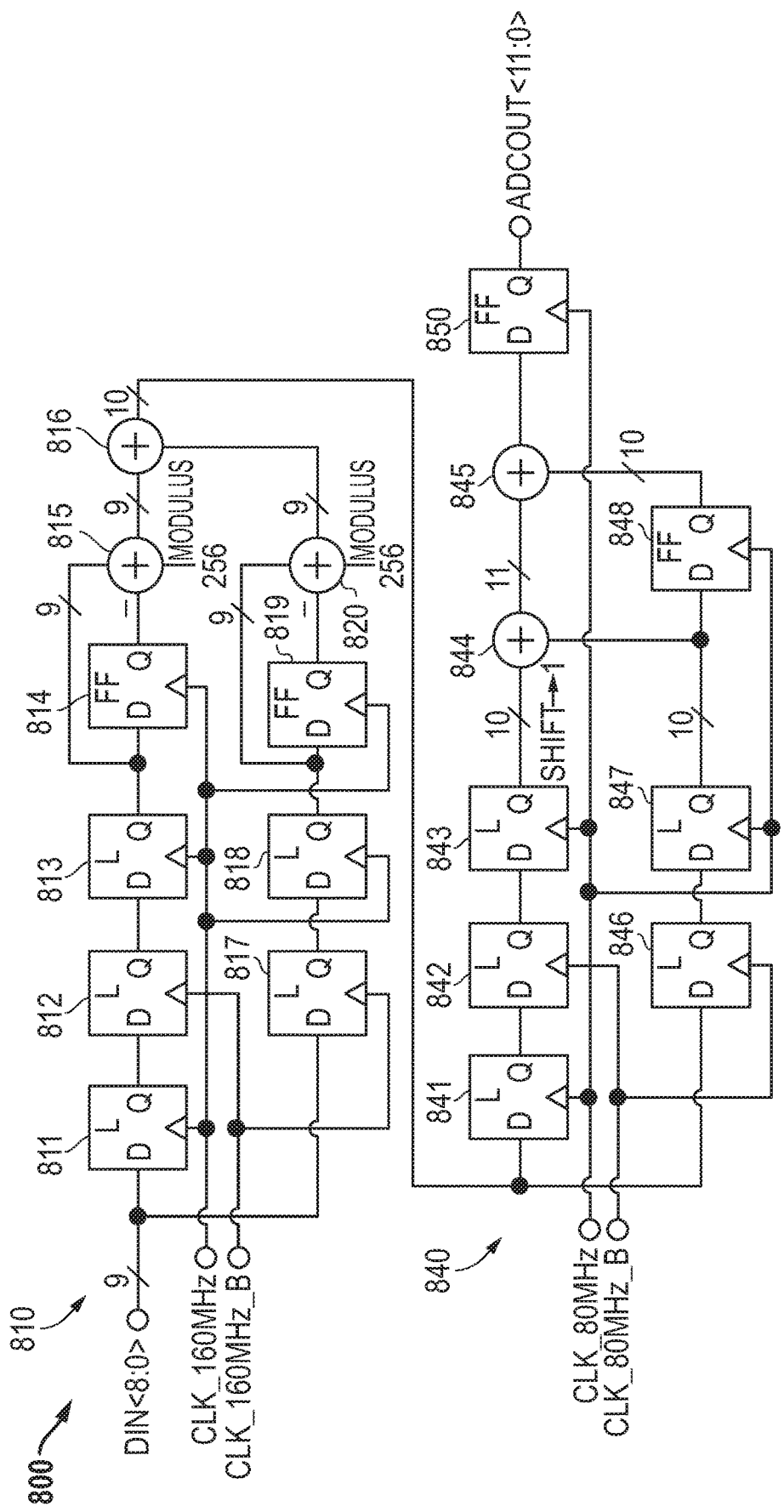
FIG. 8 illustrates in block diagram form a polyphase signal processing circuit that implements the signal processing circuit of FIG. 7.

FIG. 8 illustrates in block diagram form a polyphase signal processing circuit 800 that implements signal processing circuit 700 of FIG. 7. Polyphase signal processing circuit 800 includes a first stage 810, a second stage 840, and an output latch 850. First stage 810 corresponds to first stage 610 of signal processing circuit 600 and first stage 710 of signal processing circuit 700 and includes latches 811-813, a flip-flop 814, adders 815 and 816, latches 817-818, a flip-flop 819, and adder 820. Latch 811 is a clocked D latch having a 9-bit D input for receiving a 9-bit data input signal DIN[8:0] corresponding to signal X(z), a clock input for receiving a 160 MHz clock signal labeled "CLK_160MHZ", and a Q output. Latch 812 is a clocked D latch having a D input connected to the Q output of latch 811, a clock input for receiving a 160 MHz clock signal labeled "CLK_160MHZ_B", and a Q output. Latch 813 is a clocked D latch having a D input connected to the Q output of latch 812, a clock input for receiving the CLK_160MHZ_B signal, and a Q output. Flip-flop 814 is a clocked D flip-flop (or half latch) having a D input connected to the Q output of latch 813, a clock input for receiving the CLK_160MHZ signal, and a Q output. Adder 815 has a positive input connected to the Q output of latch 813, a negative input connected to the Q output of flip-flop 814, a positive input for receiving a constant 256, and an output. Adder 816 has a first positive input connected to the output of adder 815, a second positive input, and an output for providing a 10-bit output. Latch 817 is a clocked D latch having a 9-bit D input for receiving data input signal DIN[8:0], a clock input for receiving the CLK_160 MHz_B signal, and a Q output. Latch 818 is a clocked D latch having a 9-bit D input connected to the output of latch 817, a clock input for receiving the CLK_160 MHz signal, and a Q output. Flip-flop 819 is a clocked D flip-flop having a D input for receiving data input signal DIN[8:0], a clock input for receiving the CLK_160 MHz signal, and a Q output. Adder 820 has a positive input connected to the Q output of latch 818, a negative input connected to the Q output of flip-flop 819, a positive input for receiving a constant 256, and an output connected to the second positive input of adder 816.

Second stage 840 corresponds to second stage 620 of signal processing circuit 600 and second stage 720 of signal processing circuit 700 and includes latches 841-843, adders 844 and 845, latches 846 and 847, a flip-flop 848, and an output latch 850. Latch 841 is a clocked D latch having a 10-bit D input connected to the output of adder 816, a clock input for receiving an 80 MHz clock signal labeled "CLK_80MHZ", and a Q output. Latch 842 is a clocked D latch having a D input connected to the Q output of latch 841, a clock input for receiving a complement of the CLK_80MHZ signal labeled "CLK_80MHZ_B", and a Q output. Latch 843 is a clocked D latch having a D input connected to the Q output of latch 842, a clock input for receiving the CLK_80MHZ signal, and a 9-bit Q output shifted by one to the upper 10 bits of a 10-bit bus. Adder 844 has a first positive 10-bit input connected to the Q output of latch 843, a second positive 10-bit input, and an 11-bit output. Adder 845 has a first positive input connected to the Q output of latch 843, a second positive input, and an output. Latch 846 is a clocked D latch having a D input connected to the output of adder 816, a clock input for receiving a complement of the CLK_80MHZ_B signal, and a Q output. Latch 847 is a clocked D latch having a D input connected to the Q output of latch 846, a clock input for receiving the CLK_80MHZ signal, and a 10-bit Q output connected to the second positive input of adder 844. Flip-flop 848 is a clocked D flip-flop having a D input connected to the Q output of latch 847, a clock input for receiving the CLK_80MHZ signal, and a 10-bit Q output connected to the second positive input of adder 845.

Output latch 850 is a clocked D flip-flop having a D input connected to the Q output of adder 845, a clock input for receiving the CLK_80MHZ signal, and a 12-bit Q output for providing the ADCOUT[11:0] signal, i.e. Y(z).

In operation, polyphase signal processing circuit 800 efficiently implements the signal processing operations of signal processing circuit 600 of FIG. 6 and signal processing circuit 700 of FIG. 7. In first stage 810, latches 817 and 818, flip-flop 819, and adder 820 provide an output equal to $(1-z^{-2})$ while performing 2:1 down sampling with latches 817 and 818 clocked respectively with CLK_160MHZ_B and CLK_160MHZ. Since adder 820 operates on a 2:1 decimated input at 160 MHz instead of 320 MHz, it is able to perform addition at the slower 160 MHz clock compared to decimation filter 340 of FIG. 3. Likewise latches 811-813, flip-flop 814, and adder 815 provide an output equal to $z^{-1}(1-z^{-2})$ while performing 2:1 down sampling with latches 812 and 813 clocked respectively with CLK_160MHZ_B and CLK_160MHZ. Since adder 815 operates on a 2:1 decimated input at 160 MHz instead of 320 MHz, it is able to perform addition at the slower 160 MHz clock compared to decimation filter 340 of FIG. 3. Adder 816 provides the sum which is equal to $(1-z^{-2})+z^{-1}(1-z^{-2})$, the desired transfer function of first stage 810.

In second stage 840, latches 841-843 and the shifting performed between the output of latch 843 and the input of adder 844 implements the odd order term $2z^{-2}$ that, because of the 2:1 decimation, becomes $2z^{-4}$. Latches 846 and 847, flip-flop 848, and adders 844 and 845 implement the odd order term $(1+z^{-2})$ that, because of the 2:1 decimation, becomes $(1+z^{-4})$, while combining it with the odd order term. Thus, first stage 810 and second stage 840 together perform the transfer function of Equation [4].

In the aggregate, differential ADC 500 using decimation filter 540 requires a significantly lower amount of digital circuitry and power consumption that differential ADC 300 of FIG. 3. In the example of FIG. 8, differential ADC 500 uses a total of only 26 full adders operating at 320 MHz, 17 full adders at 160 MHz, and 21 full adders operating at 80 MHz, 44 D-type latches operating at 320 MHz, 28 D-type latches operating at 160 MHz, and 48 D-type latches operating at 80 MHz. Thus differential ADC 500 provides significantly lower power consumption using a significantly lower number of logic circuits than differential ADC 300.

Thus, the ADC disclosed above can be used to implement an efficient differential ADC based on the ring-oscillator architecture. It increases efficiency by combining digital signal processing functions performed in each of the two ADCs with the signal processing functions of performed by the decimation filter. By eliminating operations that cancel each other out and by performing various operations at slower clock frequencies, differential ADC 500 both saves power and reduces circuit area.

The above-disclosed subject matter is to be considered illustrative, and not restrictive, and the appended claims are intended to cover all such modifications, enhancements, and other embodiments that fall within the true scope of the claims. For example, various decimation filters can be implemented. While the differential ADC was described using a sample clock frequency of 320 MHz with a decimated output provided at 80 MHz, other frequencies and decimation ratios can be used as well. Each phase sampling circuit can be formed with or without range extension logic circuits. The ring-oscillator circuits can also be formed using a variety of known architectures.

Thus, to the maximum extent allowed by law, the scope of the present invention is to be determined by the broadest permissible interpretation of the following claims and their equivalents, and shall not be restricted or limited by the foregoing detailed description.

What is claimed is:

1. An analog-to-digital converter (ADC), comprising:
   a first ring oscillator ADC responsive to a true input voltage having an output for providing a first digital phase signal having a first predetermined number of bits sampled at a first frequency;
   a second ring oscillator ADC responsive to a complementary input voltage having an output for providing a second digital phase signal having said first predetermined number of bits sampled at said first frequency;
   a modulus subtractor for subtracting said second digital phase signal from said first digital phase signal to provide a phase difference signal; and
   a decimation filter for differentiating said phase difference signal at a second frequency lower than said first frequency to provide a frequency signal proportional to a differential voltage between said true input voltage and said complementary input voltage, and decimating said frequency signal to provide a digital code having a second predetermined number of bits greater than said first predetermined number of bits.

2. The ADC of claim 1, wherein:
   said decimation filter is a polyphase filter.

3. The ADC of claim 1, wherein said decimation filter comprises:
   a first portion having an input coupled to said output of said modulus subtractor, and an output for providing said frequency signal; and
   a second portion having an input coupled to said output of said first portion, and an output for providing said digital code having a magnitude proportional to a difference between said true input voltage and said complementary input voltage.

4. The ADC of claim 3, wherein:
   said first portion operates at said second frequency; and
   said second portion operates at a third frequency lower than said second frequency.

5. The ADC of claim 4, wherein:
   said second frequency is equal to one-half of said first frequency, and said third frequency is equal to one-half of said second frequency.

6. The ADC of claim 1, wherein:
   said decimation filter performs a sinc filter.

7. The ADC of claim 1, wherein:
   each of said first and second digital phase signals has a word width equal to $M+K*\log_2(D)$, in which M is a width in bits of said phase difference signal, K is an order of said decimation filter, and D is a decimation ratio of said decimation filter.

8. The ADC of claim 1, wherein each of said first and second ring oscillator ADCs is a range-extending ring oscillator ADC.

9. The ADC of claim 8, wherein each of said first and second ring oscillator ADCs comprises:
   a ring oscillator having an input for receiving a respective one of said true input voltage and said complement input voltage, and an output for providing a digital code representative of a phase of said ring oscillator;
   a sampler and decoder circuit having an input coupled to said output of said ring oscillator, a clock input for receiving a first clock signal having said first frequency, and an output for providing a first portion of said first predetermined number of bits; and
   a range extending logic circuit coupled to said ring oscillator and responsive to a clock signal and having an output for providing a count signal in response to said ring oscillator wrapping around,
   wherein each of said first and second ring oscillator ADCs forms an output thereof by concatenating said output of said sampler and decoder circuit and said output of said range extending logic circuit.

10. An analog-to-digital converter (ADC), comprising:
    a first ring oscillator having an input for receiving a true input voltage, and an output;
    a first phase sampling circuit having an input coupled to said output of said first ring oscillator, a clock input for receiving a first clock signal having a first frequency, and an output;
    a second ring oscillator having an input for receiving a complementary input voltage, and an output;
    a second phase sampling circuit having an input coupled to said output of said second ring oscillator, a clock input for receiving said first clock signal, and an output;
    a modulus subtractor having a positive input coupled to said output of said first phase sampling circuit, a negative input coupled to said output of said second phase sampling circuit, and an output; and
    a decimation filter having an input coupled to said output of said modulus subtractor, and an output for providing a digital code, said decimation filter differentiating said output of said modulus subtractor at a second frequency lower than said first frequency to provide a frequency signal, and decimating said frequency signal to provide said digital code.

11. The ADC of claim 10, wherein:
    said decimation filter is a polyphase filter.

12. The ADC of claim 10, wherein said decimation filter comprises:
a first portion having an input coupled to said output of said modulus subtractor, and an output for providing said frequency signal; and
a second portion having an input coupled to said output of said first portion, and an output for providing said digital code at a magnitude proportional to a difference between said true input voltage and said complementary input voltage.

13. The ADC of claim 12, wherein:
said first portion operates at said second frequency; and
said second portion operates at a third frequency lower than said second frequency.

14. The ADC of claim 13, wherein:
said second frequency is equal to one-half of said first frequency, and said third frequency is equal to one-half of said second frequency.

15. The ADC of claim 10, wherein:
said decimation filter comprises a sinc filter.

16. The ADC of claim 10, wherein said first phase sampling circuit comprises:
a first sampler and decoder circuit having an input coupled to said output of said first ring oscillator, a clock input for receiving said first clock signal, and an output forming a first portion of a first predetermined number of bits of said output of said first phase sampling circuit; and
a first range extending logic circuit coupled to said first ring oscillator and responsive to said first clock signal and having an output for providing a first count signal forming a second portion of said first predetermined number of bits in response to said first ring oscillator wrapping around.

17. The ADC of claim 16, wherein said second phase sampling circuit comprises:
a second sampler and decoder circuit having an input coupled to said output of said second ring oscillator, a clock input for receiving said first clock signal, and an output forming a first portion of said first predetermined number of bits of said output of said second phase sampling circuit; and
a second range extending logic circuit coupled to said second ring oscillator and responsive to said first clock signal and having an output for providing a first count signal forming a second portion of said first predetermined number of bits in response to said second ring oscillator wrapping around.

18. A method of forming a digital code representing a difference between a true input voltage and a complementary input voltage, comprising:
operating a first ring oscillator at a speed proportional to the true input voltage;
operating a second ring oscillator at a speed proportional to the complementary input voltage;
at a first frequency:
sampling an output of said first ring oscillator to provide a first sampled signal and decoding said first sampled signal to provide a first phase signal;
sampling an output of said second ring oscillator to provide a second sampled signal and decoding said second sampled signal to provide a second phase signal; and
subtracting said second phase signal from said first phase signal to form a phase difference signal,
differentiating said phase difference signal at a second frequency lower than said first frequency to form a differentiated phase difference signal; and
decimating said differentiated phase difference signal.

19. The method of claim 18 wherein decimating said differentiated phase difference signal comprises decimating said differentiated phase difference signal at a third clock frequency lower than said second frequency.

20. The method of claim 18, further comprising:
extending a range of said sampling said output of said first ring oscillator by counting a number of times said first ring oscillator wraps around and sampling said counting at said first frequency;
forming said first phase signal further in response to said sampling an output of said first ring oscillator and to said extending said range of said sampling said output of said first ring oscillator;
extending a range of said sampling said output of said second ring oscillator by counting a number of times said second ring oscillator wraps around and sampling said counting at said first frequency; and
forming said second phase signal further in response to said sampling an output of said second ring oscillator and to said extending said range of said sampling said output of said second ring oscillator.

* * * * *